(12) United States Patent
Aicher et al.

(10) Patent No.: US 8,013,615 B2
(45) Date of Patent: Sep. 6, 2011

(54) DIAGNOSTIC CIRCUIT AND METHOD OF TESTING A CIRCUIT

(75) Inventors: Jochen Aicher, Rietheim-Weilheim (DE); Robert J. Alvord, Elmwood Park, IL (US); James W. Kopec, St. Charles, IL (US); Vu T. Nguyen, Carol Stream, IL (US)

(73) Assignee: Diehl Ako Stiftung & Co. KG, Wangen (DE)

( * ) Notice: Subject to any disclaimer, the term of this patent is extended or adjusted under 35 U.S.C. 154(b) by 674 days.

(21) Appl. No.: 12/039,209

(22) Filed: Feb. 28, 2008

(65) Prior Publication Data
US 2009/0219034 A1    Sep. 3, 2009

(51) Int. Cl.
*G01R 31/02* (2006.01)
*G01R 31/08* (2006.01)

(52) U.S. Cl. .................... 324/537; 324/522

(58) Field of Classification Search .............. 324/537, 324/522
See application file for complete search history.

(56) References Cited

U.S. PATENT DOCUMENTS

| | | | |
|---|---|---|---|
| 5,900,682 A * | 5/1999 | Hung | 307/125 |
| 7,183,334 B2 | 2/2007 | Guzauskas | |
| 7,183,934 B2 | 2/2007 | Alvord | |

* cited by examiner

*Primary Examiner* — Amy He
(74) *Attorney, Agent, or Firm* — Laurence A. Greenberg; Werner H. Stemer; Ralph E. Locher

(57) ABSTRACT

A diagnostic circuit is configured for connecting to a unit under test that has a load and a sinusoidal source. The diagnostic circuit includes a voltage sensing device that has an input for sensing a signal, a first terminal for connecting to the load, a second terminal for connecting to the sinusoidal source, and a relay connected between the first and second terminals for connecting the sinusoidal source to the load. Clamping diodes are provide for clamping a sinusoidal signal and include a first clamping diode connected between a D/C voltage source and the input and a second clamping diode connected between ground and the input. A resistor is connected between the D/C voltage source and the first terminal. The diagnostic circuit verifies the operational functionality of the load, related wiring and connections.

3 Claims, 5 Drawing Sheets

DIAGNOSTIC CIRCUIT AND METHOD OF TESTING A CIRCUIT

BACKGROUND OF THE INVENTION

1. Field of the Invention

The invention relates to a diagnostic circuit and more specifically to a diagnostic circuit for trouble shooting electronic control units of appliances.

2. Description of the Related Art

Current sensing diagnostic circuits are often used in appliances (e.g. refrigerators) to monitor the operation of electrical components such as, for example, control units of the appliance. During testing, a current should flow when a controlled relay is commanded to close, and a sensor detects that current and reports that the electrical component being tested is operating as intended. If, however, current does not flow through the diagnostic circuit when the relay is commanded to close, the sensor notes the absence of that current and reports to a controller (e.g. microprocessor) that the electrical component is not functioning properly. When the electrical component is not working, malfunctioning, and the like, a technician is often summoned to repair and/or replace the electrical component in the appliance. Unfortunately, an indication of a failure of the electrical component to function properly can occur when a variety of different faults (e.g. an open load, a disconnected wire, and the like) are experienced and/or the electrical component itself is damaged. Therefore, the technician will have to check a number of different potential problems to determine which electrical component has actually failed, which electrical component needs to be replaced, which leads or connections to check, and the like.

Often a current transformer is used in the diagnostic circuit for supplying the current. However, the dynamic range of currents in modern appliances is 10 mA to 25 A. Such a wide range of currents is difficult to produce using a current transformer and requires multiple current transformers leading to a complex diagnostic circuit. In addition, current sensing cannot differentiate between an open load and a defective load.

It is a well-known problem that service technicians have a tendency to automatically replace electronic control units when repairing an appliance. Unfortunately, most of the replaced electronic control units are not defective. There is a need to provide a simple, low cost diagnostic circuit that proves that the control unit is functioning properly and that problems are most likely not related to the electronic control unit.

BRIEF SUMMARY OF THE INVENTION

It is accordingly an object of the invention to provide a diagnostic circuit and a method of testing a circuit that overcomes the above-mentioned disadvantages of the prior art device and methods of this general type, which provides an inexpensive yet effective diagnostic test device for testing control units.

With the foregoing and other objects in view there is provided, in accordance with the invention, a diagnostic circuit for connecting to a unit under test that has a load and a sinusoidal source. The diagnostic circuit includes a voltage sensing device with an input for sensing a signal, a first terminal for connecting to the load, a second terminal for connecting to the sinusoidal source, and a relay connected between the first and second terminals for connecting the sinusoidal source to the load. Clamping diodes are provided and include a first clamping diode connected between a D/C voltage source and the input and a second clamping diode connected between the ground and the input. A resistor is connected between the D/C voltage source and the first terminal.

In accordance with an added feature of the invention, a capacitor is connected between the input and ground for filtering the signals. At least one further resistor is connected between the input and the first terminal for limiting a current sensed at the input.

In accordance with another feature of the invention, the voltage sensing device is a micro-controlled analog-to-digital converter circuit.

With the foregoing and other objects in view there is further provided, in accordance with the invention, a diagnostic circuit for connecting to a unit under test having a load and two lines of a sinusoidal source. The diagnostic circuit includes a voltage sensing device having a first input and a second input, terminals including first terminals for connecting to the load and second terminals for connecting to the two lines of the sinusoidal source, relays each connected between one of the second terminals and one of the first terminals for connecting the sinusoidal source to the load, and a first diode pair having a first clamping diode connected between a D/C voltage source and the first input and a second clamping diode connected between ground and the first input. A second diode pair is provided and has a first clamping diode connected between the D/C voltage source and the second input and a second clamping diode connected between ground and the second input.

In accordance with an additional feature the invention, a first capacitor is connected between the first input and ground, and a second capacitor is connected between the second input and ground. Ideally, at least one first resistor is connected between the first input and a first one of the first terminals for limiting a current sensed at the first input. Furthermore, at least one second resistor is connected between the second input and a second one of the first terminals for limiting a current sensed at the second input. A first pull-down resistor is connected between the first input and ground, and a second pull-down resistor is connected between the second input and ground.

With the foregoing and other objects in view there is further provided, in accordance with the invention, a diagnostic circuit for connecting to a unit under test having a load and a sinusoidal source. The diagnostic circuit includes a voltage sensing device having an input for sensing a signal, terminals including first terminals for connecting to the load and a second terminal for connecting to the sinusoidal source, a relay connected between one of the first terminals and the second terminal for connecting the sinusoidal source to the load, and clamping diodes including a first clamping diode connected between a D/C voltage source and the input and a second clamping diode connected between ground and the input. In this embodiment, a first capacitor is connected between ground and a first one of the first terminals, and a second capacitor is connected between the clamping diodes and a second one of the first terminals.

In accordance with a further feature of the invention, at least one resistor is connected between the input and one of the first and second capacitors.

With the foregoing and other objects in view there is additionally provided, in accordance with the invention, a diagnostic circuit for connecting to a unit under test having a load and a sinusoidal source. The diagnostic circuit contains a voltage sensing device having a first input for sensing a signal and a second input, terminals including a first terminal for connecting to the load and a second terminal for connecting to the sinusoidal source, a relay connected between the first terminal and the second terminal for connecting the sinusoidal source to the load, and clamping diodes including a first clamping diode connected between a D/C voltage source and the input and a second clamping diode connected between ground and the input. A first capacitor is connected between the first terminal and the first input and a second capacitor connected between the second terminal and the second input.

In accordance with another added feature of the invention, at least one resistor is connected between the first input and the first capacitor.

With the foregoing and other objects in view there is additionally provided, in accordance with the invention, a diagnostic circuit for connecting to a unit under test having a load and three lines of a sinusoidal source. The diagnostic circuit contains a voltage sensing device having a first input and a second input, terminals including first terminals for connecting to the load and second terminals for connecting to two lines of the sinusoidal source, relays each connected between one of the second terminals and one of the first terminals for connecting the sinusoidal source to the load, a first diode pair having a first clamping diode connected between a D/C voltage source and the first input and a second clamping diode connected between ground and the first input, and a second diode pair having a first clamping diode connected between the D/C voltage source and the second input and a second clamping diode connected between ground and the second input. A first capacitor is connected between a first of the first terminals and the first input; and a second capacitor is connected between a second of the first terminals and the second input.

In accordance with a further feature of the invention, a third capacitor is connected between a third line of the sinusoidal source and the ground.

In accordance with another feature of the invention, at least one resistor is connected between the first input and the first capacitor. Preferably, at least one resistor is connected between the second input and the second capacitor.

With the foregoing and other objects in view there is additionally provided, in accordance with the invention, a method for testing a circuit. The method includes the steps of connecting a diagnostic test circuit to a load terminal of the circuit and to a line of a sinusoidal source of the circuit; maintaining a relay connected between the load terminal and the line in an open position; sensing a first voltage signal at a sensing node coupled to the load terminal; deriving an operational condition of the circuit in dependence on the first voltage signal sensed.

In accordance with an added mode of the invention, there are the further steps of switching the relay to a closed position for connecting the load to the sinusoidal source; sensing a second voltage signal at the sensing node; and deriving the operational condition of the circuit in dependence on the second voltage signal sensed. The circuit is considered to be error free if the first voltage signal is less than 4 V D/C and that the second voltage signal is an oscillating signal. The circuit is considered to be defective if the first voltage signal is greater than 4.5 V D/C or no oscillating signal is detected.

With the foregoing and other objects in view there is provided, in accordance with the invention, a method for testing a circuit. The method includes the steps of connecting a diagnostic tester to a load terminal of the circuit and to two lines of a multi-phase sinusoidal source of the circuit; maintaining a first relay, of the diagnostic tester, connected between a first load terminal and a first line in an open position; maintaining a second relay, of the diagnostic tester, connected between a second load terminal and a second line in an open position; sensing a first voltage signal at a first sensing node coupled to the first load terminal; sensing a second voltage signal at a second sensing node coupled to the second load terminal; and deriving an operational condition of the circuit in dependence on the first and second voltage signals sensed.

In accordance with an added mode of the invention, there are the further steps of switching the first relay to a closed position for connecting the load to a first line of the multiphase sinusoidal source; sensing a third voltage signal at the first sensing node; sensing a fourth voltage signal at the second sensing node; and deriving the operational condition of the circuit in dependence on the third and fourth voltage signals sensed.

In accordance with a further mode of the invention, there are the further steps of switching the first relay to an opened position; switching the second relay to a closed position for connecting the load to a second line of the multiphase sinusoidal source; sensing a fifth voltage signal at the first sensing node; sensing a sixth voltage signal at the second sensing node; and deriving the operational condition of the circuit in dependence on the fifth and sixth voltage signals sensed.

In accordance with another added mode of the invention, there are the further steps of switching the first relay to a closed position; maintaining the second relay at the closed position; sensing a seventh voltage signal at the first sensing node; sensing an eighth voltage signal at the second sensing node; and deriving the operational condition of the circuit in dependence on the seventh and eighth voltage signals sensed.

The circuit is considered error free if the first and second voltage signals are logic low. The circuit is considered error free if the third and fourth voltage signals are oscillating signals having the same phase. The circuit is considered error free if the fifth and sixth voltage signals are oscillating signals having the same phase. The circuit is considered error free if the seventh and eighth voltage signals are oscillating signals having different phases.

Other features which are considered as characteristic for the invention are set forth in the appended claims.

Although the invention is illustrated and described herein as embodied in a diagnostic circuit and a method of testing a circuit, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

DESCRIPTION OF THE PREFERRED EMBODIMENTS OF THE INVENTION

Figure 1:
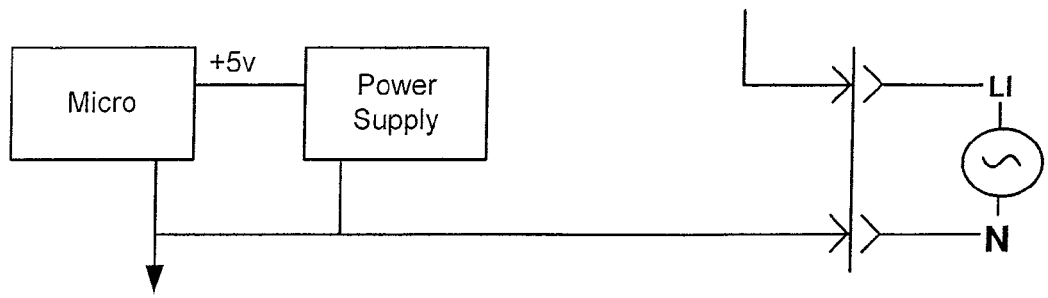
FIG. 1 is a block diagram of a basic circuit.
Figure 2:
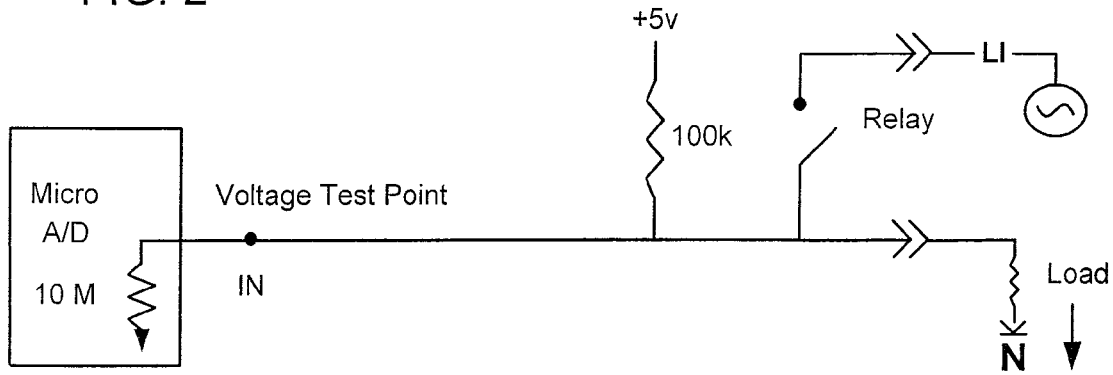
FIG. 2 is a schematic diagram for explaining basic testing techniques.

Referring now to the figures of the drawing in detail and first, particularly, to FIG. 1 thereof, there is shown a basic circuit which shows a connection from logic ground of a micro-controlled A/D device MICRO to neutral N of a mains power supply. An operational equivalent schematic circuit with the addition of a relay RELAY is shown in FIG. 2 for testing a proper connection to a load LOAD with the return to neutral N traversing through the D/C circuit ground. With the relay RELAY open a simple voltage divider network is formed with the voltage being read at an input IN of the A/D device being a voltage sensing device. Table I shows the expected voltage readings in dependence on the ohmic resistance of the load.

TABLE I

| Load | Voltage at Input IN |
|---|---|
| 1k ohm | 0.05 volts |
| 10k ohm | 0.45 volts |
| 100k ohm | 2.5 volts |
| Open | 5 volts |

Based on the voltages observed one can make conclusions about the operational functionality of the load such as a control device of an appliance.

Figure 3:
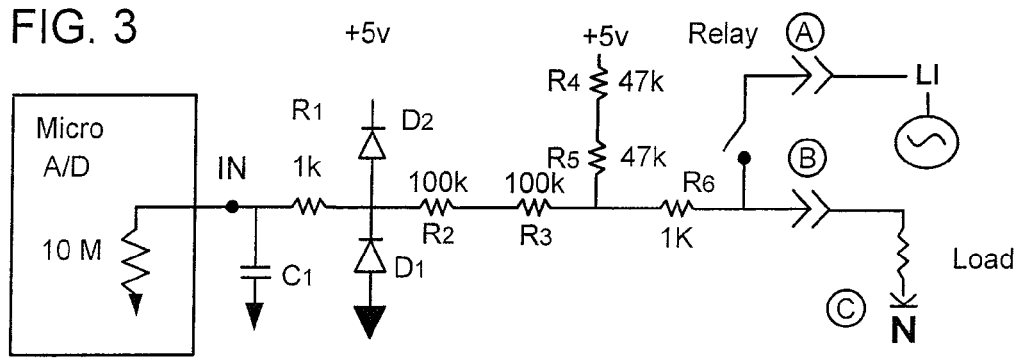
FIG. 3 is a schematic diagram of a first embodiment of a diagnostic circuit according to the invention.

FIG. 3 shows a first embodiment of a diagnostic circuit according to the invention following the basic concepts taught in FIGS. 1 and 2 that is ideally suited for lower current loads typically energized by 120 V A/C. In FIG. 3, a filter capacitor C1 is provided for filtering noise. Clamping diodes D1 and D2 are provided for clamping A/C voltages and turning A/C sinusoidal signals into a square wave clamped between 0 and 5 volts. Voltage and current limiting resistors R1, R2, R3 protect the circuit from high currents. Resistors R4 and R5 are provided for current limiting and redundancy. Resistor R6 is also provided for current limiting. The load LOAD represents a control unit of an appliance or the unit under test. Three connection points A, B and C are shown, two connection points A and B are for connecting the diagnostic circuit to the appliance, specifically an A/C source line L1 and the load LOAD. An internal connection C is the connection to A/C neutral N. The diagnostic circuit measures all readings at the input IN for determining test results. The following table now defines the operation of the diagnostic test circuit when it is hooked up for eight different diagnostic results. In Table II it is assumed that the load LOAD is less than 300 K ohms. Of course it goes without saying that the value of the resistors shown in FIG. 3 is dependent of the value of the load LOAD.

TABLE II

| | Point A | Point B | Point C | Relay | Reading at IN | Comment |
|---|---|---|---|---|---|---|
| 1. | Connected | Connected | Connected | Open | $V_{A/D} < 4$ V | No errors detected |
| 2. | Connected | Connected | Connected | Closed | 60 Hz square wave (in phase with L1) | No errors detected |
| 3. | Connected | Connected | Connected | Error - Stuck closed (s/b open) | 60 Hz square wave (in phase with L1) | Error detected in relay operation. |
| 4. | Disconnected | Connected | Connected | Open | $V_{A/D} < 4.0$ V | Error in line undetected |
| 5. | Disconnected | Connected | Connected | Closed | $V_{A/D} > 4.5$ V | Error detected at relay or line L1 dependant on configuration. |
| 6. | Connected | Disconnected | Connected | Open | $V_{A/D} > 4.5$ V | Error detected, no load or wiring open. |
| 7. | Connected | Connected | Disconnected | Open | $V_{A/D} > 4.5$ V | Error detected, no load or wiring open |
| 8. | Connected | Connected | Disconnected | Closed | 60 Hz square wave (in phase with L1) | Error not detected |

Rows 1 and 2 show conditions in which everything is working properly and no errors are detected. Row 3 shows the condition in which the relay RELAY of the diagnostic test circuit is detected as faulty (e.g. stuck closed). Row 4 shows the condition where the line L1 is faulty (open) but it is not diagnosed until the conditions in row 5 are performed. In row 5 a 60 Hz square wave was anticipated but a D/C voltage level is detected. Row 6 shows the conditions from determining a load failure or an internal connection to neutral N failure because a 60 Hz square wave was expected but only a D/C voltage reading was measured. In row 7 the error is not detected.

For controlling more than one load, the circuit in FIG. 3 can be repeated for each additional load.

Figure 4:
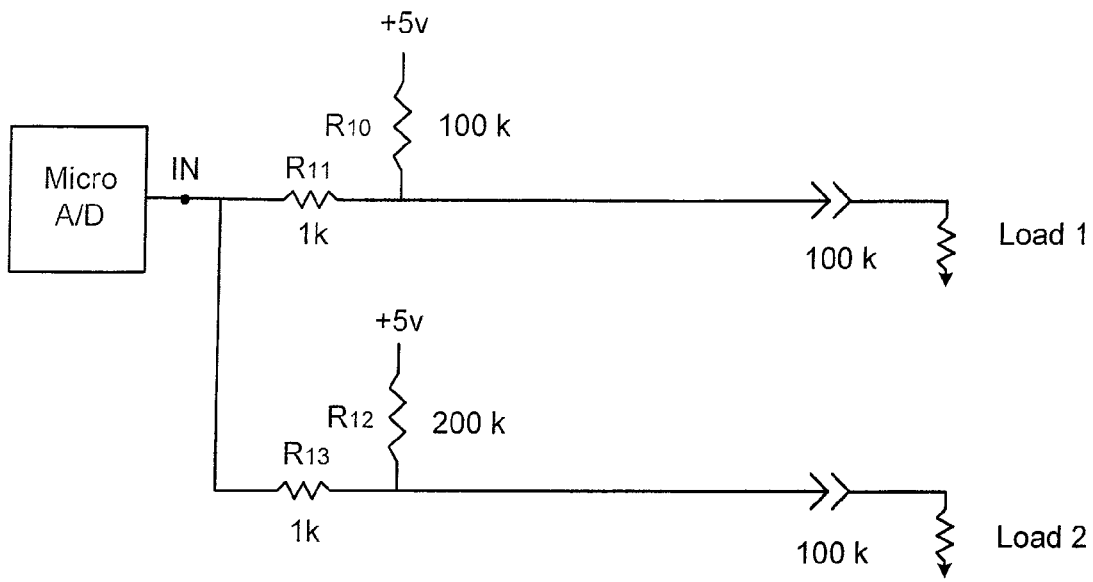
FIG. 4 is a schematic diagram of a second embodiment of the diagnostic circuit according to the invention.

FIG. 4 shows a second embodiment of the diagnostic circuit in which loads LOAD 1 and LOAD 2 can be multiplexed and in which only one micro-controlled A/D device MICRO is needed. In addition, for simplicity FIG. 4 omits protective devices such as current and/or voltage limiting resistors and capacitive filters. In FIG. 4, two pull-up resistors R10, R12 are connected between a respective load LOAD 1, LOAD 2 and a 5 volts source. Between each load LOAD 1, LOAD 2 and the one micro-controlled A/D device MICRO is a resistor R11, R13, respectively. Table III shows the expected voltage results to be seen at the input IN.

TABLE III

| Load Connection | Voltage Seen at IN |
|---|---|
| Load 1 connected<br>Load 2 connected | 2.1 volts |
| Load 1 Open<br>Load 2 Connected | 2.5 volts |
| Load 1 Connected<br>Load 2 Open | 1.67 volts |
| Load 1 Open<br>Load 2 Open | 5 volts |

From Table III it is easy to ascertain voltage ranges to determine pass and fail criteria for the loads. For example, a voltage greater than 4.5 volts indicates that both loads failed, a voltage in the range of 1.9 to 2.3 volts indicates that both loads passed, a voltage below 1.9 volts indicates that LOAD 2 failed, and a voltage in the range of 2.3 to 3.0 volts indicates that LOAD 1 failed. Of course the ranges are load dependent.

Figure 5:
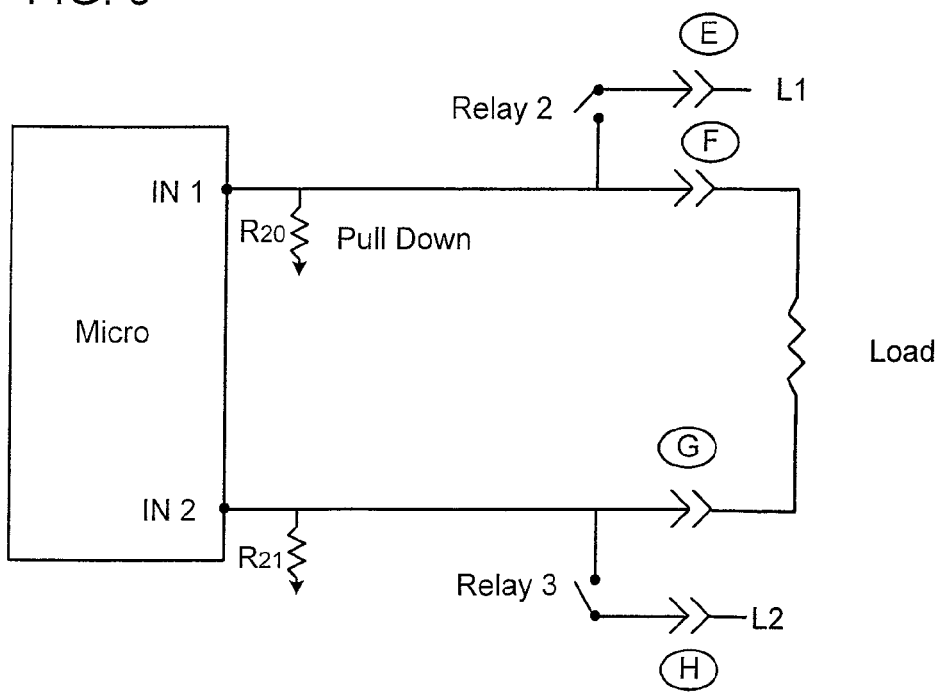
FIGS. 5-8 are schematic diagrams of a third embodiment of the diagnostic circuit according to the invention.

FIG. 5 shows a third embodiment of a simplified diagnostic circuit suited for higher current loads typically energized by 240 V A/C such as heater loads. The test circuit of FIG. 5 is ideally suited for sensing high current, lower ohm loads connected to a 240 V A/C source. In FIG. 5, the diagnostic circuit has connection points E, F, G and H for connecting to the load LOAD and to the A/C lines L1 and L2 of the appliance under test. Two relays RELAY 2 and RELAY 3 connect the A/C lines L1 and L2 to the load LOAD. Two pull down resistors R20 and R21 connect the load to ground. As in FIG. 1, the power connections are configured such that D/C ground equals or is connected to A/C neutral N (e.g. a common ground). The micro-controlled A/D device in this instance has two inputs IN1 and IN2. The pull down resistors R20 and R21 connected to the inputs IN1 and IN2 ensure a low reading with no connections. It is further noted that a digital input can be used in place of the A/D inputs. In FIG. 5 it is assumed that the load LOAD is between 15-20 ohms meaning that the current is in the 10-16 amp range for 240 V A/C.

Figure 6:
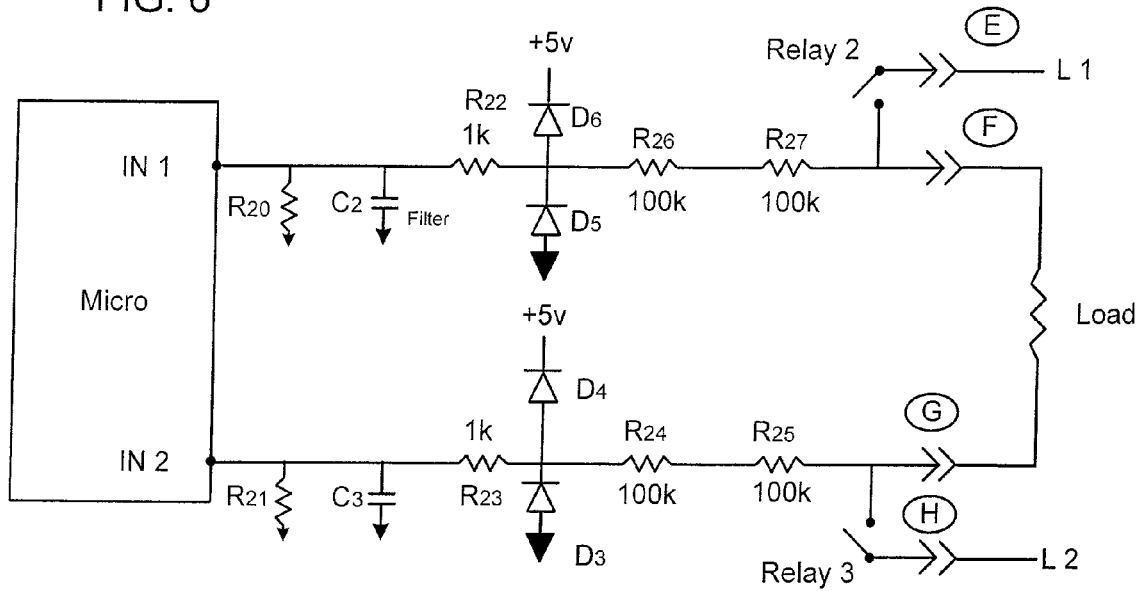

The diagnostic circuit shown in FIG. 6 is based on FIG. 5 but has incorporated protection circuitry, filtering circuitry and clamping circuitry. More specifically filtering capacitors C2 and C3, current limiting resistors R22-R27 and clamping diodes D3-D6 have been added and are functionally similarly to the same components shown in FIG. 3.

Figure 7:
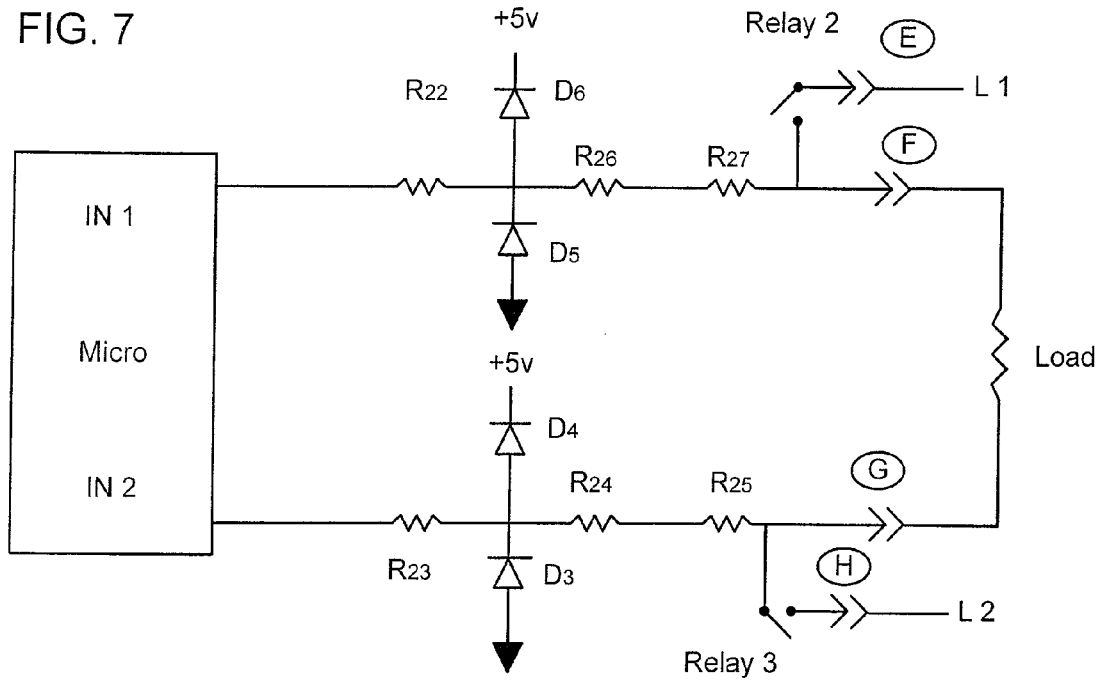
Figure 8:
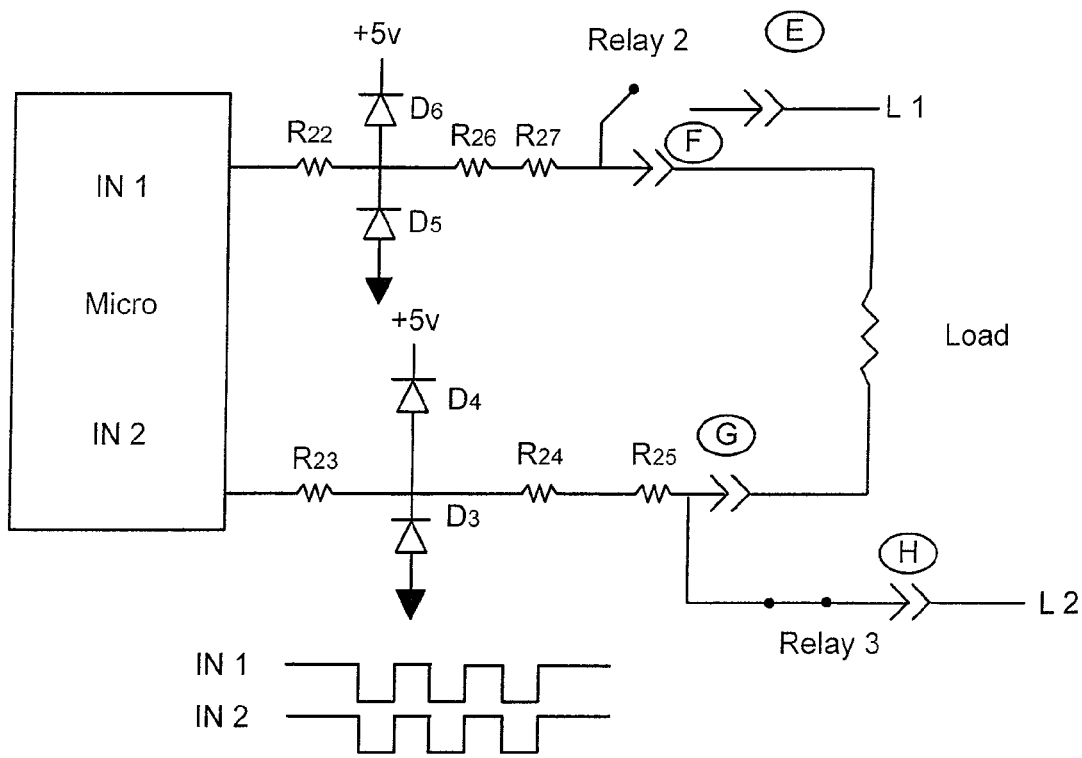

FIGS. 7 and 8 are simplified versions of FIG. 6 with only the clamping and currently limiting circuitry shown for clarity. As shown in FIG. 7, the A/C signal is provided by the line L1 to the relay RELAY 2 and conducted to the inputs IN1 and IN2 in which the sinusoidal signal is clamped by the diode pairs D5, D6 and D3, D4 respectively resulting in the shown square wave of 0 to 5 V (see FIG. 8).

FIG. 8 shows the same sinusoidal signal conducted by line L2 into relay RELAY 3 to the inputs IN1 and IN2. The sinusoidal signal on line L2 being 180° out of phase compared to the sinusoidal signal on line L1 for a two-phase sinusoidal source.

Table IV shows the operating states and expected results for the circuit shown in FIG. 6.

TABLE IV

| L1 input | L2 input | Load | Relay R2 | Relay R3 | IN 1 Digital input signal (load signal) | IN 2 Digital input signal (DLB signal) | Comment |
|---|---|---|---|---|---|---|---|
| Group A | | | | | | | |
| Connected | Connected | Connected | open | open | Logic low | Logic low | Good control and wiring |
| Connected | Connected | Connected | open | closed | 60 Hz square wave (in phase with L2) | 60 Hz square wave (in phase with L2) | Good control and wiring |
| Connected | Connected | Connected | closed | open | 60 Hz square wave (in phase with L1) | 60 Hz square wave (in phase with L1) | Good control and wiring |
| Connected | Connected | Connected | closed | closed | 60 Hz square wave (in phase with L1) | 60 Hz square wave (in phase with L2) | Good control and wiring |
| Group B | | | | | | | |
| Disconnected | Connected | Connected | open | Open | Logic low | Logic low | |
| Disconnected | Connected | Connected | open | closed | 60 Hz square wave (in phase with L2) | 60 Hz square wave (in phase with L2) | |

TABLE IV-continued

| L1 input | L2 input | Load | Relay R2 | Relay R3 | IN 1 Digital input signal (load signal) | IN 2 Digital input signal (DLB signal) | Comment |
|---|---|---|---|---|---|---|---|
| Disconnected | Connected | Connected | closed | Open | Logic low | Logic low | Error detected L1 disconnect |
| Disconnected | Connected | Connected | closed | closed | 60 Hz square wave (in phase with L2) | 60 Hz square wave (in phase with L2) | Error detected L1 disconnect |
| Group C | | | | | | | |
| Connected | Disconnected | Connected | open | open | Logic low | Logic low | |
| Connected | Disconnected | Connected | open | closed | Logic low | Logic low | Error detected L2 disconnect |
| Connected | Disconnected | Connected | closed | open | 60 Hz square wave (in phase with L1) | 60 Hz square wave (in phase with L1) | |
| Connected | Disconnected | Connected | closed | closed | 60 Hz square wave (in phase with L1) | 60 Hz square wave (in phase with L1) | Error detected L2 disconnect |
| Group D | | | | | | | |
| Connected | Connected | Disconnected | open | open | Logic low | Logic low | |
| Connected | Connected | Disconnected | open | closed | Logic low | 60 Hz square wave (in phase with L2) | Error detected load disconnect |
| Connected | Connected | Disconnected | closed | open | 60 Hz square wave (in phase with L1) | Logic low | Error detected load disconnect |
| Connected | Connected | Disconnected | closed | closed | 60 Hz square wave (in phase with L1) | 60 Hz square wave (in phase with L2) | |
| Group E | | | | | | | |
| Connected | Connected | Connected | Closed s/b open | Open | 60 Hz square wave (in phase with L1) | 60 Hz square wave (in phase with L1) | Relay/control error detected |

TABLE IV-continued

| L1 input | L2 input | Load | Relay R2 | Relay R3 | IN 1 Digital input signal (load signal) | IN 2 Digital input signal (DLB signal) | Comment |
|---|---|---|---|---|---|---|---|
| Connected | Connected | Connected | Open | Closed s/b open | 60 Hz square wave (in phase with L2) | 60 Hz square wave (in phase with L2) | Relay/control error detected |

Group A shows the four conditions of a properly functioning load and wiring with no errors detected.

Group B shows the error detected when line L1 is disconnected. However, we are not sure whether it is a line L1 connection error or a relay RELAY 2 error. It is generally assumed that it is the line L1 connection as the diagnostic circuit is periodically checked.

Group C shows the error detected when line L2 is disconnected. As stated above, we are not sure whether it is the line L2 connection error or a relay RELAY 3 error. It is assumed to be a line L2 error.

Group D shows the error when the load LOAD is not properly connected.

Group E shows the case when relay RELAY 2 is stuck closed when it should be open.

Group F shows the case when relay RELAY 3 is stuck closed when it should be open.

Figure 9:
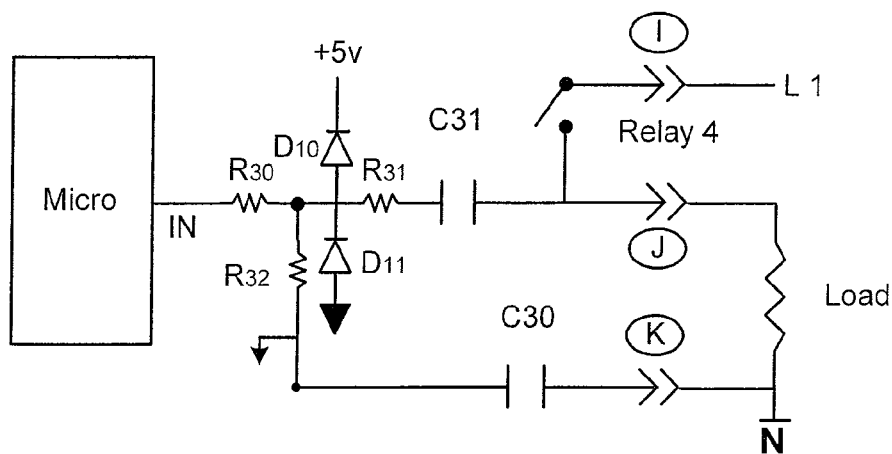
FIG. 9 is a schematic diagram of a fourth embodiment of the diagnostic circuit according to the invention.
Figure 10:
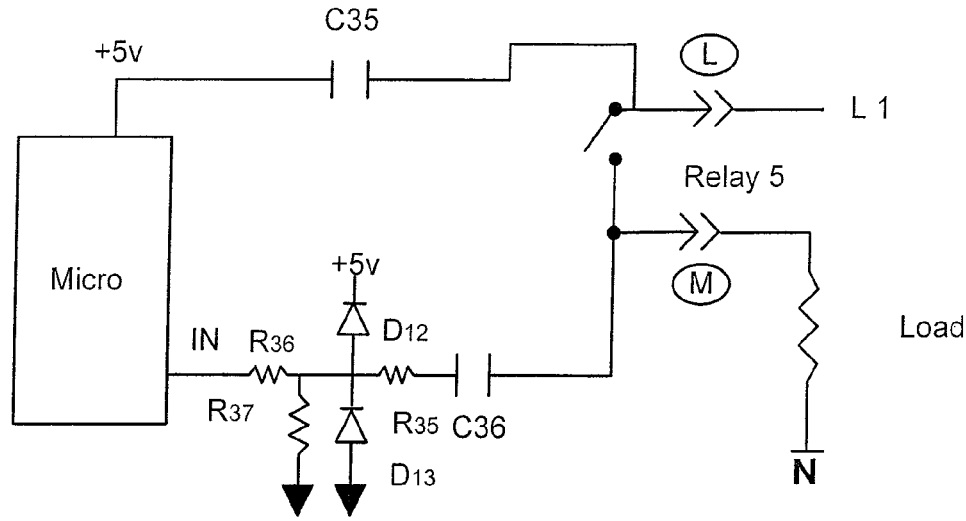
FIG. 10 is a schematic diagram of a fifth embodiment of the diagnostic circuit according to the invention.
Figure 11:
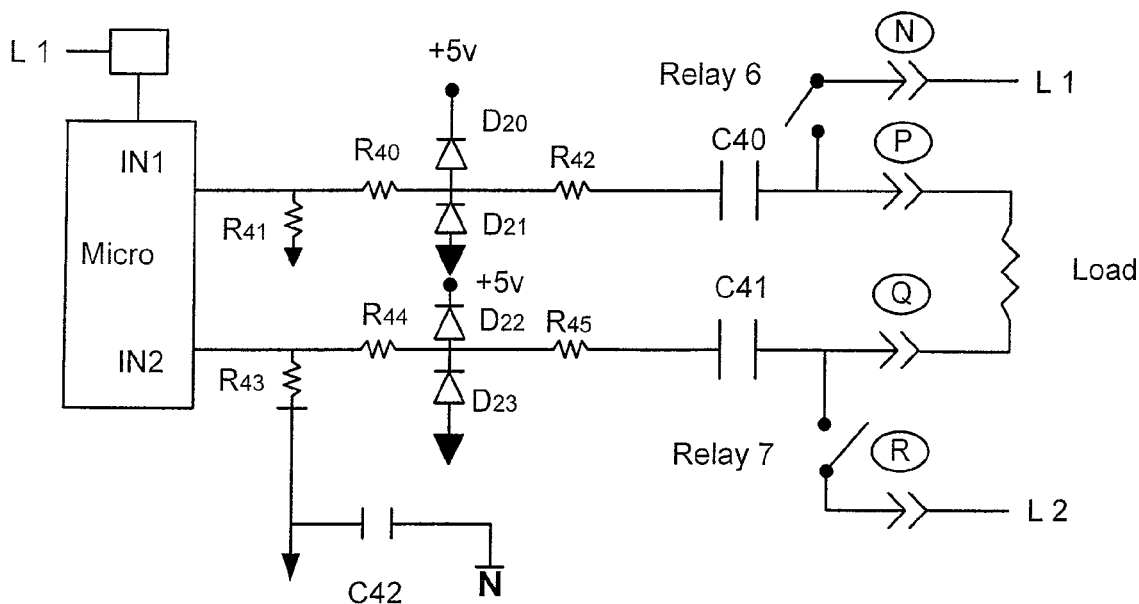
FIG. 11 is a schematic diagram of a sixth embodiment of the diagnostic circuit according to the invention.

FIGS. 9-11 illustrate variations on a fourth embodiment of the diagnostic circuit. FIG. 9 shows the use of an isolation capacitor C31 for isolating the micro-controlled A/D device MICRO from the relay RELAY 4 and the load LOAD. A further isolation capacitor C30 isolates D/C ground from A/C neutral N. As with the previous embodiments we have current/voltage limiting resistors R30, R31, R32 for circuit protection and clamping diodes D10, D11 for transforming the sinusoidal A/C signal at 120 V AC to a 5 V square wave having the same frequency. We have three connecting terminals 1, J and K for connecting to the appliance under test and the micro-controlled A/D device MICRO has an input IN where all the voltage readings are taken.

Table V shows the expected results for a properly operating load and relay and further identifies various errors.

TABLE V

| L1 input | Load | Relay | Result at input In |
|---|---|---|---|
| Connected | Connected | Open | Logic low |
| Connected | Connected | Closed | 60 Hz square wave (in phase with L1) |
| 3. Connected | Connected | Stuck closed, s/b open | 60 Hz square wave - Error detected (in phase with L1) |
| 4. Disconnected - Error | Connected | Open | Logic low, error not detected |
| 5. Disconnected - Error | Connected | Closed | Logic low, error detected |
| 6. Connected | Disconnected - Error | Open | Logic low, error is not detected |
| 7. Connected | Disconnected - Error | Closed | 60 Hz square wave Error is not detected |

In rows 1 and 2 a properly functioning circuit is detected and no errors are diagnosed. In row 3, it is detected that the relay RELAY 4 is stuck closed because the square wave is detected. In row 4, line L1 is disconnected but the error is not yet detected. In row 5, the error in line L1 is detected because no square wave is detected after the relay RELAY 4 is closed. In rows 6 and 7 the load LOAD 4 is disconnected but is not detected. In essence line L1 errors are detectable but the load error is not with this circuit.

FIG. 10 shows an alternative version of the isolation type diagnostic test circuit. A relay RELAY 5 is connected between the line L1 and the load LOAD. A first isolation capacitor C35 isolates the 5 V source from the line L1. A second isolation capacitor C36 isolates the micro-controlled A/D device MICRO from the relay RELAY 5 and the load LOAD. As with the previous embodiments we having current/voltage limiting resistors R35, R36 for circuit protection and clamping diodes D12, D13 for transforming the sinusoidal A/C signal to a 5 V square wave having the same frequency. We have two connecting terminals L and M for connecting to the appliance under test. The micro-controlled A/D device MICRO has the input IN where all the voltage readings are taken.

Table VI shows the expected results for a properly operating load and relay and further identifies various errors.

TABLE VI

| L1 input | Load 5 | Relay 5 | Result at input IN |
|---|---|---|---|
| 1. Connected | Connected | Open | 60 Hz square wave (180° out of phase with L1) |
| 2. Connected | Connected | Closed | Initial pulse high then logic low |
| 3. Connected | Connected | Stuck closed, s/b open | Logic low - Error is detected |
| 4. Disconnected - Error | Connected | Open | 60 Hz square wave (180° out of phase with L1) |
| 5. Disconnected - Error | Connected | Closed | 60 Hz square wave (180° out of phase with L1) - Error is detected |
| 6. Connected | Disconnected - Error | Open | Logic low - Error is detected |
| 7. Connected | Disconnected - Error | Closed | Pulse high then logic low |

Rows 1 and 2 show the expected results being dependent on the AC signal input from line L1 or neutral N being 180° out of phase from line L1. In row 3 the relay RELAY 5 is diagnosed as stuck open because only a logic low is detected. In row 4, no error is detected but this error is detected in row 5 when the square wave is sensed. In row 6, the error in load LOAD 5 is detected when no square wave is sensed. In row 7, the error is not detected.

FIG. 11 shows a capacitively isolated diagnostic test circuit for a three phase, 240 V A/C signal. Terminals N, P, Q and R supply connection points to the unit under test for connecting lines L1, L2 to relays RELAY 6 and RELAY 7 respectively and to the load LOAD. Isolation capacitors C40, C41, and C42 isolate the lines L1, L2 and neutral N from the rest of the circuit. Current protection resistors R40-R45 are provided as are the clamping diode sets D20, D21 and D22, D23 for protecting the micro-controlled A/D device MICRO from harmful high-level currents and voltages. FIG. 11 further shows a reference clock driven by line L1.

Table VII shows the expected results for a properly operating load and relay and further identifies various errors.

TABLE VII

| L1 input | L2 input | Load | Relays 6-7 | Result at IN 1 | Result at IN 2 |
|---|---|---|---|---|---|
| Connected | Connected | Connected | Both open | Logic low | Logic low |
| 2. Connected | Connected | Connected | L1 relay 6 closed | 60 Hz square wave (in phase with L1) | 60 Hz square wave (in phase with L1) |
| 3. Connected | Connected | Connected | L2 relay 7 closed | 60 Hz square wave (in phase with L2) | 60 Hz square wave (in phase with L2) |
| 4. Connected | Connected | Connected | Both relays closed | 60 Hz square wave (in phase with L1) | 60 Hz square wave (in phase with L2) |
| 5. Dis-connected | Connected | Connected | Both open | Logic low | Logic low |
| 6. Dis-connected | Connected | Connected | L1 relay 6 closed | Logic low Error detected | Logic low Error detected |
| 7. Connected | Dis-connected | Connected | Both open | Logic low | Logic low |
| 8. Connected | Dis-connected | Connected | L2 relay 7 closed | Logic low Error detected | Logic low Error detected |
| 9. Connected | Connected | Disconnected | Both open | Logic low | Logic low |
| 10. Connected | Connected | Disconnected | L1 relay 6 closed | 60 Hz square wave (in phase with L1) | Logic low Error detected |
| 11. Connected | Connected | Disconnected | L2 relay 7 closed | Logic low Error detected | 60 Hz square wave (in phase with L2) |

Rows 1-4 show the various connection configurations for a properly operating load and relays and the expected results at the inputs IN 1 and IN 2. Row 5 is the case where the line L1 is disconnected but this error is not detected until the configuration of row 6 is set up and a square wave is expected but only a logic low signal is detected. Row 7 is the case where the line L2 is disconnected but this error is not detected until the circuit configuration of row 8 is set up and a square wave is expected but only a logic low signal is detected. Row 9 is the case where the load LOAD is disconnected but the disconnection is not diagnosed until the circuit conditions of either row 10 or 11 are performed and logic low conditions are detected at one of the inputs.

We claim:

1. A diagnostic circuit for connecting to a unit under test having a load and a sinusoidal source, the diagnostic circuit comprising:
   a voltage sensing device having an input for sensing a signal;
   a first terminal for connecting to the load and a second terminal for connecting to the sinusoidal source;
   a relay connected between said first and second terminals for connecting the sinusoidal source to the load;
   a D/C voltage source and ground;
   clamping diodes including a first clamping diode connected between said D/C voltage source and said input and a second clamping diode connected between said ground and said input; and a resistor connected between said D/C voltage source and said first terminal;

wherein said voltage sensing device is a micro-controlled analog to digital converter circuit; and wherein said relay has an open state in which said first terminal and said second terminal are not connected together, and the sinusoidal source is disconnected from said voltage sensing device when said relay is in the open state.

2. The diagnostic circuit according to claim 1, further comprising a capacitor connected between said input and said ground.

3. The diagnostic circuit according to claim 1, further comprising at least one further resistor connected between said input and said first terminal for limiting a current sensed at said input.

\* \* \* \* \*